US012066464B2

(12) United States Patent
Stollwerck et al.

(10) Patent No.: US 12,066,464 B2
(45) Date of Patent: Aug. 20, 2024

(54) SENSORED INSULATION PLUG

(71) Applicant: 3M INNOVATIVE PROPERTIES COMPANY, St. Paul, MN (US)

(72) Inventors: Gunther A. J. Stollwerck, Krefeld (DE); Mark Gravermann, Erkelenz (DE)

(73) Assignee: 3M Innovative Properties Company, St. Paul, MN (US)

( * ) Notice: Subject to any disclaimer, the term of this patent is extended or adjusted under 35 U.S.C. 154(b) by 155 days.

(21) Appl. No.: 17/937,847

(22) Filed: Oct. 4, 2022

(65) Prior Publication Data

US 2023/0115600 A1  Apr. 13, 2023

(30) Foreign Application Priority Data

Oct. 7, 2021 (EP) .................................. 21201460

(51) Int. Cl.
*G01R 15/06* (2006.01)
*G01R 15/16* (2006.01)
*H01B 17/56* (2006.01)

(52) U.S. Cl.
CPC ............. *G01R 15/16* (2013.01); *H01B 17/56* (2013.01)

(58) Field of Classification Search
CPC ...................................................... G01R 15/16
See application file for complete search history.

(56) References Cited

U.S. PATENT DOCUMENTS 6,031,368 A * 2/2000 Klippel .................. G01R 15/06
324/133

FOREIGN PATENT DOCUMENTS

| EP | 0691721 B1 | 8/1998 |
| EP | 2947466 A1 | 11/2015 |
| EP | 3070481 A1 | 9/2016 |
| EP | 3575804 A1 | 12/2019 |
| EP | 3882642 A1 | 9/2021 |
| WO | 2013086069 A2 | 6/2013 |
| WO | 2020055666 A1 | 3/2020 |

OTHER PUBLICATIONS

Extended European Search Report received for EP Application No. 21201460.9, mailed on Mar. 10, 2022, 2 pages.

* cited by examiner

*Primary Examiner* — Alesa Allgood

(74) *Attorney, Agent, or Firm* — Gregg H. Rosenblatt

(57) ABSTRACT

A sensored insulation plug for a separable connector in a MV/HV power distribution network of a national grid, operable to sense the MV/HV elevated voltage. The sensored insulation plug includes a plug body formed by a solidified insulating material, a contact piece, and a discrete coupling capacitor embedded in the insulating material and operable to harvest energy from the elevated voltage of the contact piece and optionally operable to superimpose a communication voltage signal over the elevated voltage. The sensored insulation plug further includes an integrated sensing capacitor, operable as a high-voltage capacitor in a sensing voltage divider for sensing the elevated voltage. The sensing capacitor comprises a high-voltage electrode comprising the coupling electrode and the contact piece, a tubular sensing electrode, and a dielectric comprising a portion of the insulating material.

15 Claims, 4 Drawing Sheets

SENSORED INSULATION PLUG

TECHNICAL FIELD

This disclosure relates to insulation plugs for separable connectors in medium-voltage and high-voltage power distribution networks. In particular, it relates to such plugs that have a voltage sensing feature. The disclosure also relates to power distribution networks with separable connectors having such sensored plugs installed therein and to processes of upgrading separable connectors with such sensored insulation plugs.

BACKGROUND

Power distribution networks transmitting electrical power in large geographic areas, such as national grids, are becoming more complex to operate because nowadays consumers can generate energy on their premises and feed it into these networks in a decentralized manner, at unpredictable times and in unpredictable amounts. Network operators place voltage sensing devices in electrical installations at key locations of their network, such as in switchgears or transformers, to collect information about the current state of their power network.

In a medium-voltage or high-voltage power distribution network, a power cable is typically connected to network apparatus, such as switchgears or transformers, by a separable connector, also often referred to as a removable power connector or T-body connector, mounted at the end of the cable. Such separable connectors have a front cavity to receive a protruding portion of a bushing of the apparatus, and a connection element on high or medium voltage. The connection element is in electrical contact with the cable conductor and can be mechanically and electrically connected to the bushing, e.g. via a threaded stud accessible through an opposed rear cavity of the separable connector. After installation, the rear cavity is filled by inserting a so-called insulation plug, which insulates the connection element.

Elements of a voltage sensor for measuring the voltage of the connection element of a separable connector—and thereby the voltage of the power cable—can be integrated into the insulation plug, making it a "sensored insulation plug". A voltage sensor of that type is described, for example, in the U.S. Pat. No. 6,031,368 and in the European patent application published as EP 3 070 481 A1. Often, such sensors use voltage dividers to sense the voltage. For the high voltages involved capacitive voltage dividers are generally considered advantageous as they do not require a conductive connection with components on the high voltage and are thereby inherently safer.

As used herein, the high-voltage portion of a voltage divider is the portion that is electrically arranged between a signal contact, at which a divided voltage can be picked up, and a contact for connection to the elevated voltage which is to be sensed. The low-voltage portion of the voltage divider is the portion that is electrically arranged between that signal contact and a contact for connection of the voltage divider to electrical ground. The divided voltage varies proportionally with the elevated voltage, it is therefore also referred to herein as the "signal voltage". The dividing ratio, i.e. the proportionality factor between the elevated voltage and the signal voltage, depends on the ratio of the total impedance of the high-voltage portion to the total impedance of the low-voltage portion of the voltage divider. By measuring the signal voltage of the signal contact and applying the proportionality factor, the elevated voltage of the connection element can be sensed. A signal wire may be connected to the signal contact to lead the signal voltage to some measurement circuitry outside the sensored insulation plug.

In order to sense the voltage of the connection element with high accuracy, a capacitive voltage divider (a "sensing voltage divider") may be used, of which the dividing ratio is precisely known. The high-voltage portion of such a sensing voltage divider is often a single capacitor, the "sensing capacitor" or the "high-voltage capacitor" of the voltage divider. Advantageously the sensing capacitor, or the entire high-voltage portion, is accommodated in the sensored insulation plug, making use of the insulative properties of the body of the insulation plug.

Discrete capacitors that have both a high voltage rating and a larger capacity are generally rare and expensive. The term "discrete capacitor", as used herein, refers to an individual capacitor having an individual nominal capacitance that exists independently from the structure of the insulation plug. A surface-mount capacitor is an example of a discrete capacitor. Where a voltage sensor for elevated voltages requires a capacitor having a high voltage rating and a comparatively small capacity, instead of a discrete capacitor, an integrated capacitor can be used, i.e. a capacitor that is formed by structural elements of the insulation plug rather than by a separate, discrete electrical device.

Embedding capacitors of a medium-voltage/high-voltage (MV/HV) voltage divider in a body made of a solidified insulating material is a proven method of obtaining a strong, mostly void-free electrical insulation, with the added benefit of mechanical rigidity of the body. When manufacturing such a body, a liquid, viscous, insulating material flows around the electrodes of integrated capacitors in a mold, filling all available space and thus reducing the risk of formation of voids. The insulating material is then caused to cure and thereby solidify. The solidified insulating material forms the body of the sensored insulation plug.

The value of the sensed voltage will normally be transmitted—in analogue or digital form—to the network operator via electronic circuits of a communication network. Those circuits may be comprised in the sensored insulation plug according to the present disclosure. They may, for example, be arranged within the body of the insulation plug or attached to the body of the insulation plug. Such circuits require electrical energy at a low voltage, e.g. at 5 Volt. Electrical energy is available in the vicinity of the sensored insulation plug, but at much higher voltages and therefore not directly usable to power electronic communication circuits. In a traditional switchgear, power at low voltages is not available. So traditionally, for powering electronic communication circuits either low voltage power from an external power supply, e.g. outside the switchgear, had to be brought close to the sensored insulation plug, or a dedicated close-by transformer transformed the elevated voltage down to the low voltages required. These approaches, however, require extra equipment and extra cabling between the power supply and the sensored insulation plug. The extra equipment and the extra cabling, in turn, require some of the scarce space in the vicinity of the insulation plug, such as in a switchgear housing or in a transformer housing of a power network.

It is, therefore, desirable to reduce the number of external devices, the amount of external cabling and the amount of space occupied by such external devices and cables, while maintaining the ability to transmit the value of the sensed voltage via an external communication network to the network operator. A need exists for a sensored insulation plug that senses the elevated voltage at high accuracy, transmits sensor information towards the network operator, and requires no external power supply.

SUMMARY

In an attempt to address this need, the present disclosure provides a sensored insulation plug for being inserted into a rear cavity of a medium voltage or high-voltage separable connector in a power distribution network of a national grid, and operable to insulate a connection element of the separable connector on an elevated voltage and to sense the elevated voltage, the sensored insulation plug comprising
  a) a plug body formed by a solidified insulating material and rotationally symmetric about a plug axis defining axial directions and radial directions orthogonal to the axial directions;
  b) an electrically conductive contact piece, mechanically and conductively connectable with the connection element on elevated voltage;
  c) a discrete coupling capacitor, operable to harvest energy from the elevated voltage of the contact piece and optionally operable to superimpose a communication voltage signal over the elevated voltage of the contact piece, wherein the coupling capacitor is embedded in the insulating material and comprises a coupling electrode, electrically connected to the contact piece, and an opposed harvesting electrode;
  d) an integrated sensing capacitor, operable as a high-voltage capacitor in a sensing voltage divider for sensing the elevated voltage, the sensing capacitor comprising
    i) a high-voltage electrode, wherein the high-voltage electrode comprises the coupling electrode and the contact piece;
    ii) a tubular sensing electrode, embedded in the insulating material and arranged around an axial section of the high-voltage electrode; and
    iii) a dielectric comprising a portion of the insulating material.

While the sensing capacitor can be used in a sensing voltage divider to sense the elevated voltage of the contact piece, e.g. at an accuracy of 2% or better, the coupling capacitor can be used for harvesting energy from the elevated voltage of the contact piece. The harvested energy can be used to operate electronic circuitry in the sensored insulation plug which processes the sensor data, and optionally other electronic circuitry which transmit processed data to outside the insulation plug. The coupling capacitor may be also usable for transmitting processed data from the electronic circuitry into the power network using known power line communication ("PLC") technology, or alternatively for transmitting processed data from the electronic circuitry in a wireless manner via an antenna to a distant receiver.

The arrangement of the energy-harvesting coupling capacitor within the plug body makes an external power supply and the associated cabling obsolete and saves the space necessary to accommodate such a power supply and such cabling. Also, the insulating material of the plug body can provide proper insulation of the coupling capacitor, making additional insulation for the coupling capacitor unnecessary.

The present disclosure relates to sensored insulation plugs for use in medium-voltage or high-voltage power distribution networks in which electrical power is distributed over large geographic areas via HV/MV power cables, transformers, switchgears, substations etc. with currents of tens or hundreds of amperes and voltages of tens of kilovolts. The term "medium voltage" or "MV" as used herein refers to AC voltages in the range of 1 kilovolt (kV) to 72 kV rms, whereas the term "high voltage" or "HV" refers to AC voltages of more than 72 kV rms. Medium voltage and high voltage are collectively referred to herein as "elevated voltage".

Many separable connectors are T-shaped or elbow-shaped. A separable connector as referred to herein usually has a front cavity to receive a protruding portion of a bushing of a switchgear or a transformer, and an opposed rear cavity facilitating access to a connection element, such as a cable lug, on elevated voltage inside the separable connector. The connection element is conductive and is electrically and mechanically connected to the power conductor of the power cable. The connection element can be connected mechanically and electrically, e.g. by a conductive threaded stud, to a conductive element of the bushing, so that power can flow from the power cable through the connection element, the stud and the bushing into the switchgear or transformer. When the separable connector is in use, the connection element is on the elevated voltage of the power conductor of the cable.

Certain separable connectors are described in the European patent application EP 0 691 721 A1. Examples of traditional separable connectors are the 3M™ 600 Amp T-Bodies 5815 Series from 3M Co., St. Paul, Minnesota, U.S.A., or the "(M) (P) 480 TB separable tee shape connector" of Nexans Network Solutions N. V., Erembodegem, Belgium.

The rear cavity of a separable connector can receive a matching insulation plug to insulate the connection element and to fill the space of the rear cavity to reduce the risk of electrical discharges. Such matching pairs of separable connector and insulation plug are commercially available at moderate cost. In many cases, the mechanical interface between a separable connector and an insulation plug is governed by de-facto standards. Many of such interfaces conform to an existing standard for bushings, some form a Type C interface as described in the German standards DIN EN 50180 for bushings and DIN EN 50181 for plug-in type bushings, others conform to ANSI/IEEE standard 386. Often, bodies of insulation plugs are slightly larger than the rear cavity, so that after the insulation plug is urged into the rear cavity with some force, the surfaces of plug and cavity are in an intimate surface contact, thus reducing the risk of electrical discharges.

The body of a sensored insulation plug according to the present disclosure is shaped for mating with a rear cavity of a separable connector in the same way as the body of a non-sensored insulation plug. The plug body may be rotationally symmetric about a plug axis. The plug body may, for example, have a frustoconical shape for being inserted into a corresponding frustoconical recess of corresponding shape (the rear cavity) at a rear side of the separable connector, thereby mating the sensored insulation plug with the separable connector.

The plug body may have, in axial directions, a low-voltage end portion and an opposed high-voltage end portion, wherein the high-voltage end portion comprises the contact piece and is, in use, closer to the connection element of the separable connector.

A connection element of a separable connector is electrically connected to the conductor of the power cable terminated by the separable connector and is on elevated voltage when the cable is in use.

Some separable connectors comprise a connection element such as a cable lug, attached to the end of the central conductor of the power cable and protruding into a space between the front cavity and the rear cavity. The protruding portion of the connection element usually has an aperture or a thread for attachment to a stud or screw which connects the connection element electrically and mechanically, e.g. with a conductor of a bushing.

The connection element of the separable connector serves to electrically and mechanically connect the power cable and the separable connector to a bushing. The high-voltage electrode of the sensing capacitor of the sensed insulation plug as described herein is—when in use—directly electrically connected to the connection element, so that a voltage sensor based on a voltage divider comprising the sensing capacitor in its high-voltage portion can sense the elevated voltage of the connection element and thereby the elevated voltage of the power cable conductor, after connection of the power cable to the bushing.

As used herein, "sense" and "sensing" refer to a higher-precision measurement of the elevated voltage, such as 5% precision or better, 2% precision or better, or 1% precision or better. "Sensing" is different from "detecting" which refers to identifying presence or absence of an elevated voltage.

The sensing capacitor is operable as a high-voltage capacitor in the sensing voltage divider for sensing the elevated voltage with a higher degree of precision. The sensing voltage divider may be a capacitive voltage divider. The connection element of a separable connector is electrically connected to the sensing voltage divider such that the sensing voltage divider can sense the elevated voltage of the connection element. For that purpose, the connection element on elevated voltage is electrically connected to the high-voltage electrode of the sensing capacitor in the sensored insulation plug which in turn is operable as a high-voltage capacitor in the sensing voltage divider for sensing the elevated voltage.

The contact piece of a sensored insulation plug according to the present disclosure is arranged in the high-voltage end portion of the plug body, as described below. A portion of the contact piece is exposed and externally accessible for facilitating establishing an electrical connection to the connection element of the separable connector.

In use, the contact piece may be not only electrically, but also mechanically connected to the connection element of the separable connector. This mechanical connection advantageously is an electrically conductive connection. The mechanical connection may be a direct mechanical connection, i.e. a portion of the contact piece is mechanically connected to the connection element without any intermediate element.

Alternatively, this connection may be an indirect mechanical connection, i.e. in use a portion of the contact piece may be connected to the connection element via an intermediate element, which is electrically conductive. The sensored insulation plug may thus further comprise an intermediate element which is operable to mechanically and electrically connect the contact piece with the connection element.

The contact piece, or an engagement portion of the contact piece, may comprise a recess to connectingly engage a stud that is connected to the connection element of the separable connector. The contact piece, or an engagement portion of the contact piece, may comprise an internal or external thread to connectingly and threadedly engage a threaded stud that is connected to the connection element of the separable connector.

The high-voltage electrode and the sensing electrode are the electrodes of the sensing capacitor. In a sensored insulation plug according to the present disclosure the high-voltage electrode comprises the coupling electrode of the coupling capacitor and the contact piece. The coupling electrode may be arranged in the coupling capacitor, e.g. in a body of the coupling capacitor, and the sensing electrode may be arranged outside the coupling capacitor. In such embodiments the dielectric of the sensing capacitor may comprise a portion of the insulating material arranged between the sensing electrode and the coupling capacitor. The dielectric of the sensing capacitor may further comprise a portion of a dielectric of the coupling capacitor. This latter portion may be arranged inside the coupling capacitor, e.g. in a body of the coupling capacitor.

In certain embodiments the coupling electrode is flat and oriented parallel to a geometric plane extending in radial directions. In other words, the coupling electrode lies in a geometric plane, and a normal on the geometric plane is parallel to axial directions. Discrete capacitors having a flat coupling electrode are commercially available at reasonable cost. The orientation of the coupling electrode can help provide for a shorter overall design of the sensored insulation plug.

Generally, the coupling electrode may have a flat major surface facing, or contacting, a dielectric of the coupling capacitor. In certain embodiments a surface normal of the flat major surface is oriented parallel to the plug axis.

Generally, the shape and orientation of the coupling electrode are not critical. For adequate voltage sensing, a shape and an orientation are preferable which allow the coupling electrode and the sensing electrode to form the electrodes of the sensing capacitor.

The high-voltage electrode comprises the coupling electrode of the coupling capacitor and the contact piece. It may further comprise a high-voltage electrode extension portion, electrically connected to the coupling electrode. The high-voltage electrode extension portion may be arranged outside of the coupling capacitor. The high-voltage electrode extension portion may be embedded in the insulating material. In preferred embodiments the high-voltage electrode is embedded in the insulating material.

In certain embodiments the high-voltage electrode is an assembly consisting of the coupling electrode and the contact piece.

In certain preferred embodiments, the tubular sensing electrode is shaped and arranged such as to be generally rotationally symmetric about the plug axis of the sensored insulation plug. The high-voltage electrode may be shaped and arranged such as to be generally rotationally symmetric about the plug axis of the sensored insulation plug. Independent of their shapes, the high-voltage electrode and the sensing electrode may be arranged coaxially, or concentrically with each other. Specifically, the tubular sensing electrode may be arranged coaxially around an axial section of the high-voltage electrode.

The tubular sensing electrode is arranged around an axial section of the high-voltage electrode. It may be arranged around an axial section of the coupling electrode and/or around an axial section of the contact piece. It may be arranged around an axial section of the coupling capacitor or around the entire coupling capacitor. It may be arranged around the entire contact piece. The sensing electrode being arranged around the high-voltage electrode implies that the sensing electrode, or at least an axial section of the sensing electrode, is arranged radially outward from the high-voltage electrode and surrounds at least an axial section of the high-voltage electrode. The sensing electrode, or at least an axial section of the sensing electrode, may be arranged radially outward from the coupling capacitor and may surround at least an axial section of the coupling capacitor. The sensing electrode, or at least an axial section of the sensing electrode, may be arranged radially outward from the contact piece and may surround at least an axial section of the contact piece.

In certain embodiments the plug body is rotationally symmetric about a plug axis, and the high-voltage electrode—which comprises the coupling electrode of the coupling capacitor and the contact piece—and the sensing electrode may be arranged coaxially around the plug axis, and the sensing electrode may be arranged coaxially around the high-voltage electrode. The coaxial arrangement may help to avoid concentration of electrical field lines and to provide for a reduced risk of electrical discharges. The coaxial arrangement of the sensing electrode around the high-voltage electrode may result in a space-saving arrangement of the sensing capacitor and a more even distribution of the electrical field with less risk of electrical discharges.

The expression "embedded in the plug body" as used herein refers to being surrounded completely by portions of the plug body, e.g. by portions of the insulating material forming the plug body. In particular, an electrode is considered embedded in the plug body if the plug body is cast or molded around the electrode. In a particular aspect, an element of the sensored insulation plug may be considered embedded in the plug body if a major portion, e.g. more than 90% or more than 95%, of its exterior surface is in surface contact with the solidified insulating material. Surface contact, however, is not a prerequisite for being considered "embedded", as an embedded element may, for example, be arranged in a cavity of the plug body without being in surface contact with the solidified insulating material.

The coupling capacitor is embedded in the insulating material forming the plug body. The high-voltage electrode of the sensing capacitor is embedded in the plug body. A portion of the embedded high-voltage electrode, or the entire embedded high-voltage electrode, may be in surface contact with the insulating material of the plug body.

The sensing electrode of the sensing capacitor is embedded in the plug body. The sensing electrode, or a portion of the embedded sensing electrode, may be in surface contact with the insulating material of the plug body.

The coupling capacitor is a discrete capacitor that can be operated at medium voltages or high voltages. It preferably has a comparatively high capacitance, such as a capacitance of greater than 500 picofarad (pF) or of greater than 1 nanofarad (nF). A greater capacitance generally results in the ability to harvest more energy from the elevated voltage. Capacitors of less than 100 pF are currently not perceived as useable as coupling capacitors according to the present disclosure, because they maynot be able to harvest a sufficient amount of energy within a reasonable time for powering electronic components required for transmitting data representing the signal voltage to an outside of the sensored insulation plug, e.g using power line communication or using wireless communication. Hence in certain embodiments the coupling capacitor has a capacitance of 100 picofarad or more.

In certain embodiments the coupling capacitor is a ceramic capacitor. In certain embodiments the coupling capacitor is a single-layer capacitor, such as a single-layer ceramic capacitor. Single-layer capacitors having both a high voltage withstand and a high capacity are commercially available at reasonable cost. Due to the geometry of their electrodes the electrical field between the coupling electrode and the sensing electrode is less disturbed than in scenarios in which the coupling capacitor is a multi-layer capacitor, potentially resulting in a more even distribution of electric field lines and an associated reduced risk of electrical discharges.

Although it may be preferred for the coupling capacitor to be a single-layer capacitor, in certain other embodiments the coupling capacitor is a multi-layer capacitor, e.g. a multi-layer ceramic capacitor. Although the electrical field between the coupling electrode and the sensing electrode may be disturbed, the sensing electrode and the coupling electrode can usually still form a sensing capacitor of a sufficient capacitance for precise voltage sensing.

In certain of these embodiments the coupling electrode and the harvesting electrode are arranged at opposed end portions of the coupling capacitor. The coupling electrode and the harvesting electrode may be flat electrodes, oriented parallel to each other and facing each other. A coupling capacitor dielectric material may be arranged between the coupling electrode and the harvesting electrode.

Single layer capacitors can provide both a high voltage withstand, making them suitable for use with elevated voltages, and a high capacity of 100 picofarad or more, making them suitable for use as a coupling capacitor in the present sensored insulation plug.

In specific embodiments the coupling capacitor is a ceramic single-layer capacitor and has a cylindrical shape, with the coupling electrode and the harvesting electrode being arranged at the opposed end faces of the cylindrical shape. The coupling capacitor of cylindrical shape may be arranged in the plug body coaxially with the plug axis.

The coupling capacitor is electrically connected with the contact piece on elevated voltage when in use, therefore the coupling capacitor preferably has a voltage withstand of at least one kilovolt (1 kV), of at least 10 kV, or of at least 50 kV. The choice of voltage withstand will depend, inter alia, on the expected magnitude of the elevated voltage.

Discrete capacitors of suitable capacitances for use as a coupling capacitor for medium or high voltages are commercially available, e.g. from TDK (tdk.com) or from Vishay (vishay.com).

Harvested energy is preferably used to power one or more analogue-to-digital (A/D) converters to digitize the signal voltage of the sensing voltage divider. In certain embodiments, at least a portion of the harvested energy is used to transmit at least data representing the signal voltage to an outside of the sensored insulation plug, such as to a receiving node of a communication network, e.g. of the network operator. Even low-power A/D converters and low-power transmitters require some tens of milliwatts (mW) or some hundreds of mW to operate. The capacitance of the coupling capacitor and the power consumption of the A/D converters, the transmitters and optionally of other electronic components thus need to be balanced against each other and a selection needs to be made, depending on the application needs. The geometric size of the coupling capacitor will need to be balanced against the space available in the insulation plug, against the capacitance required for harvesting an adequate amount of power, against the need for sufficient electrical insulation, and potentially against other factors.

For enabling such energy harvesting, the coupling electrode of the coupling capacitor is electrically connected to the contact piece on elevated voltage. The harvesting electrode of the coupling capacitor may be electrically connected to an harvesting circuit, comprised in the sensed insulation plug. Hence in certain embodiments the sensored insulation plug comprises a harvesting circuit, electrically connected to the harvesting electrode, and operable to harvest electrical energy from the elevated voltage.

In certain embodiments the harvesting circuit is arranged outside the plug body, e.g. remote from the plug body or in the vicinity of the plug body. It may, for example, be arranged in or on an end cap covering a low-voltage end portion of the sensored insulation plug. In such embodiments the harvesting electrode of the coupling capacitor may be electrically connected to the harvesting circuit via a harvesting wire or a harvesting cable. Hence generally the sensored insulation plug described herein may further comprise an end cap attached to a low-voltage end portion of the plug body, wherein the harvesting circuit is arranged in the end cap.

In certain other embodiments the harvesting circuit is arranged in the plug body. It may be arranged, for example, on a circuit board within the plug body or on a circuit board attached to the plug body, e.g. attached to an outer surface of the plug body. In these embodiments the harvesting electrode of the coupling capacitor may be electrically connected to the harvesting circuit via a harvesting wire embedded at least partially in the insulating material of the plug body. Arrangement inside the plug body is a particularly space-saving arrangement of the harvesting circuit, which may also protect the harvesting circuit against certain mechanical and environmental impacts. An arrangement inside the plug body may also help keep conductive connections shorter and thereby reduce ohmic losses.

An attachment of the harvesting circuit to the plug body may save space and avoid the need to use cables or wires of certain lengths for connecting the harvesting circuit to the coupling capacitor.

In certain embodiments the harvesting circuit comprises a storage capacitor for storing electrical energy harvested from the elevated voltage.

While the elevated voltage is an AC voltage, energy can more easily be harvested and stored as DC voltage and DC currents. Also, where harvested energy is used to power electric or electronic components, many such components require a DC power supply. Therefore, in certain embodiments of a sensored insulation plug according to the present disclosure the harvesting circuit comprises a rectifier, connected to the harvesting electrode, for rectifying a voltage of the harvesting electrode.

In certain of these embodiments the harvesting circuit further comprises a storage capacitor for storing harvested electrical energy. Storing the harvested energy facilitates multiplexing between harvesting time slots and PLC or wireless communication time slots, as described below in more detail.

The sensored insulation plug according to the present disclosure may comprise a dedicated signal processing circuit for processing the signal voltage of the sensing voltage divider. Processing may make the signal voltage comply with input requirements of external devices such as remote terminal units (RTUs) or with input requirements of transmission circuits such as, for example, a PLC circuit or a wireless transmission circuit as described below. The signal voltage is the voltage of the signal contact which varies proportionally with the elevated voltage. Where the high-voltage portion of the sensing voltage divider consists only of the sensing capacitor, the signal voltage is the voltage of the sensing electrode. In certain embodiments the signal voltage is processed, e.g. it is digitized, normalized, or filtered. The signal processing circuit is operable to process the signal voltage. It may be connected to the signal contact, or it may be connected to the sensing electrode.

Hence in certain embodiments the sensored insulation plug further comprises a signal processing circuit, electrically connected to the sensing electrode, and operable to process a signal voltage of the sensing electrode, wherein the signal processing circuit is electrically connected to the harvesting circuit such that the signal processing circuit receives electrical energy from the harvesting circuit.

The signal processing circuit is preferably powered by electrical energy harvested by the harvesting circuit from the elevated voltage. Alternatively, it may be provided externally with power.

The signal processing circuit may comprise an analogue-to-digital converter ("ADC") for converting an analogue signal voltage into digital data representing the signal voltage or for converting a processed analogue signal voltage into digital data representing the processed signal voltage. Hence generally, the signal processing circuit may comprise an analogue-to-digital converter for digitizing the signal voltage.

The coupling capacitor is operable to harvest energy from the elevated voltage of the contact piece. The coupling capacitor is operable to superimpose a communication voltage signal over the elevated voltage. The coupling capacitor may be adapted to transmit communication voltage signals (e.g. a data signal representing the signal voltage of the sensing voltage divider) into the elevated voltage via powerline communication ("PLC") technology. The communication voltage signals can be transmitted via the contact piece of the sensored insulation plug, the connection element of a separable connector and a conductor of a cable on which the separable connector is mounted towards a receiving node in a communication network, e.g. of the network operator. Accordingly, the coupling capacitor may be suitable for superimposing a communication voltage signal over the elevated voltage of the contact piece.

For enabling such power line communication, the coupling electrode of the coupling capacitor is electrically connected to the contact piece, and the harvesting electrode of the coupling capacitor may be electrically connected to a PLC circuit. The PLC circuit comprises electronic circuitry for powerline communication, in particular for superimposing a communication voltage signal over the elevated voltage, via the coupling capacitor, and thereby transmitting communication voltage signals (e.g. a data signal representing the signal voltage of the sensing voltage divider) into the elevated voltage and via a cable conductor towards a receiving node of a communication network, e.g. of the network operator.

Hence generally, in certain embodiments of the sensored insulation plug described herein, the sensored insulation plug further comprises a powerline communication circuit, electrically connected to the coupling capacitor, and operable to superimpose, via the coupling capacitor, a communication voltage signal over the elevated voltage, and/or operable to extract, via the coupling capacitor, a communication voltage signal from the elevated voltage.

The powerline communication circuit may be electrically connected to the harvesting circuit such that the powerline communication circuit receives electrical energy from the harvesting circuit. Alternatively, it may be externally powered.

In certain embodiments the PLC circuit is arranged outside the plug body, e.g. remote from the sensed insulation plug. It may, for example, be arranged in or on an end cap covering a low-voltage end portion of the plug body. In such embodiments the harvesting electrode of the coupling capacitor may be electrically connected to the PLC circuit via a PLC wire or a PLC cable.

In certain other embodiments the PLC circuit is arranged in the plug body. It may be arranged, for example, on a circuit board within the plug body or on a circuit board attached to the plug body, e.g. to an outer surface of the plug body. In these embodiments the harvesting electrode of the coupling capacitor may be electrically connected to the PLC circuit via a PLC wire embedded at least partially in the insulating material of the plug body.

The coupling capacitor can work for power line communication both ways. Hence it may be also operable to pick up communication voltage signals superimposed over the elevated voltage of the contact piece, i.e. it may be operable to extract, via the coupling capacitor, a communication voltage signal from the elevated voltage. With the harvesting electrode of the coupling capacitor being electrically connectable to the electronic PLC circuit, e.g. a PLC circuit arranged in the plug body or attached to the body of the sensored insulation plug, the PLC circuit may be operable to receive communication voltage signals from a transmitting node of the network operator's communication network. The PLC circuit may comprise electronic circuitry for receiving communication voltage signals (e.g. a data signal representing firmware updates for a microcontroller in the PLC circuit or representing updated calibration values or updated encryption/decryption keys) via a power cable conductor on elevated voltage from a transmitting node of a communication network, e.g. of the network operator. Accordingly, the coupling capacitor may be suitable for splitting off a communication voltage signal from the elevated voltage of the high-voltage electrode.

The coupling capacitor may not be useable for harvesting energy and for powerline communication at the same time. The sensored insulation plug may therefore comprise electronic multiplexing circuitry for defining harvesting time slots and PLC time slots.

During a harvesting time slot the multiplexing circuitry may cause the coupling electrode of the coupling capacitor to be electrically connected to the high-voltage electrode, and the harvesting electrode of the coupling capacitor to be electrically connected to the harvesting circuit and optionally disconnected from the PLC circuit described above. During a harvesting time slot the multiplexing circuitry may cause the coupling electrode of the coupling capacitor to be electrically connected to the high-voltage electrode, and the harvesting electrode of the coupling capacitor to be electrically connected to the harvesting circuit and optionally disconnected from the PLC circuit and the wireless communication circuit described above.

During a PLC time slot the multiplexing circuitry may cause the coupling electrode of the coupling capacitor to be electrically connected to the high-voltage electrode, and the harvesting electrode of the coupling capacitor to be electrically connected to the PLC circuit and optionally disconnected from the harvesting circuit described above.

As an alternative, or in addition, to transmitting or receiving communication voltage signals via power line communication, the sensored insulation plug of the present disclosure may be adapted to transmit communication voltage signals (e.g. data signals representing the signal voltage of the sensing voltage divider) in a wireless manner.

The sensored insulation plug may thus comprise a wireless communication circuit operable to generate and wirelessly transmit a communication voltage signal to outside the sensored insulation plug. The wireless communication circuit may be electrically connected to the harvesting circuit such that the wireless communication circuit receives electrical energy from the harvesting circuit. Energy harvested using the coupling capacitor may thus be used to supply electric energy to the electronic wireless communication circuit.

The wireless communication circuit may also be further operable to wirelessly receive a communication voltage signal from outside the sensored insulation plug.

For the purpose of wireless transmission or receiving, the sensored insulation plug according to the present disclosure may further comprise an antenna connected to the wireless communication circuit and operable to receive and to transmit communication voltage signals. The communication voltage signals can be transmitted via the antenna wirelessly towards a receiving node in a communication network, e.g. a communication network of the network operator.

The wireless communication circuit may be arranged in the plug body. Alternatively, it may be arranged remote from the plug body. The wireless communication circuit is operationally connected with the antenna. It comprises electronic circuitry for transmitting communication voltage signals (e.g. a data signal representing the signal voltage of the sensing voltage divider) via the antenna towards a receiving node of a communication network, e.g. of the network operator, and optionally for receiving communication voltage signals (e.g. a synchronization signal) via the antenna from a transmitting node of the communication network.

The wireless communication circuit comprises electronic circuitry for transmitting communication voltage signals (e.g. a data signal representing the signal voltage of the sensing voltage divider) wirelessly towards a receiving node of a communication network, e.g. of the network operator.

In certain embodiments the wireless communication circuit is arranged outside the plug body, e.g. remote from the plug body. It may, for example, be arranged in or on an end cap covering a low-voltage end portion of the plug body. In such embodiments the second electrode of the coupling capacitor may be electrically connected to the wireless communication circuit via a connection wire or a connection cable.

In certain other embodiments the wireless communication circuit is arranged in the plug body. It may be arranged, for example, on a circuit board within the plug body or on a circuit board attached to the plug body, e.g. to an outer surface of the plug body. In these embodiments the harvesting electrode of the coupling capacitor may be electrically connected to the wireless communication circuit via a connection wire embedded at least partially in the insulating material of the plug body.

Although the coupling capacitor may be operable for harvesting energy and wireless communication at the same time, it may be advantageous in certain scenarios to perform harvesting and wireless communication at separate times. Multiplexing circuitry may thus be operable to define harvesting time slots and wireless time slots. During a wireless time slot, the multiplexing circuitry may, for example, cause the coupling electrode of the coupling capacitor to be electrically connected to the high-voltage electrode, and the harvesting electrode of the coupling capacitor to be electrically connected to the wireless communication circuit and optionally disconnected from the harvesting circuit described above.

During a harvesting time slot the multiplexing circuitry may, for example, cause the coupling electrode of the coupling capacitor to be electrically connected to the high-voltage electrode, and the harvesting electrode of the coupling capacitor to be electrically connected to the harvesting circuit and optionally disconnected from the wireless communication circuit. During a harvesting time slot the multiplexing circuitry may cause the coupling electrode of the coupling capacitor to be electrically connected to the high-voltage electrode, and the harvesting electrode of the coupling capacitor to be electrically connected to the harvesting circuit and optionally disconnected from the wireless communication circuit and optionally disconnected from the PLC circuit described above.

The coupling capacitor forms part of a harvesting and communication setup. Both the integrated sensing capacitor and the discrete coupling capacitor are comprised in the sensored insulation plug described herein. However, not all remaining elements of the sensing voltage divider and of the harvesting and communication setup may be comprised in the sensored insulation plug. In certain embodiments, a energy harvesting electronic circuit, to which the coupling capacitor is connected, is not comprised in the sensored insulation plug, while a powerline communication electronic circuit, to which the coupling capacitor is connected, is comprised in the sensored insulation plug. In certain other embodiments, the energy harvesting electronic circuit is comprised in the sensored insulation plug, while the powerline communication electronic circuit is not comprised in the sensored insulation plug. In certain other embodiments, neither the energy harvesting electronic circuit nor the powerline communication electronic circuit is comprised in the sensored insulation plug.

The energy harvesting electronic circuit may be arranged on a printed circuit board. The powerline communication electronic circuit may be arranged on a printed circuit board. In certain preferred embodiments, both the energy harvesting electronic circuit and the powerline communication electronic circuit are comprised in the sensored insulation plug. These electronic circuits may be arranged in the plug body of the sensored insulation plug or they may be attached to the plug body, as will be detailed below. A printed circuit board on which the energy harvesting electronic circuit is arranged may be attached to the plug body. A printed circuit board on which the powerline communication electronic circuit is arranged may be attached to the plug body. A printed circuit board on which the energy harvesting electronic circuit and the powerline communication electronic circuit are arranged may be attached to the plug body.

The sensing capacitor of the sensored insulation plug described herein is suitable for sensing the elevated voltage at a precision of a few percent. It is operable as a high-voltage capacitor in a sensing voltage divider for sensing the elevated voltage. The sensing voltage divider may be adapted, e.g. by selecting a low-voltage capacitor of suitable capacitance, such that the dividing ratio is adequate to provide, for an elevated voltage of 50 kV, a signal voltage that can be processed by standard electronic circuitry, e.g. a signal voltage of a few Volt, e.g. 5 Volt. Also, it is desired to minimize parasitic capacitances. Hence preferably, the sensing capacitor has a capacitance of between about 10 pF and about 50 pF. The desired capacitance of the sensing capacitor is thus considerably different from the desired capacitance of the coupling capacitor. For this reason, the sensored insulation plug of the present disclosure comprises two separate capacitors: the sensing capacitor for high-precision voltage sensing and the coupling capacitor for energy harvesting and optionally for transmitting and optionally receiving signals via powerline communication or wireless communication. These two capacitors share the coupling electrode, connected to the contact piece, as the "source" of the elevated voltage. The sensing capacitor of the present sensored insulation plug is designed for sensing the elevated voltage to a great precision, e.g. at a precision of 5%, 2% or even 1% or better. To obtain such great precision, the dividing ratio of the sensing voltage divider must be precisely known. Certain methods of determining the dividing ratio require precise knowledge of the true capacitance of the sensing capacitor and of the true capacitance(s) of the low-voltage capacitor(s) at the time of performing the voltage sensing. The true capacitance of the sensing capacitor is essentially its nominal capacitance, which is modified by certain variations, such as, for example, variations introduced by ageing effects or temperature effects on the dielectric, geometric variations of the distance between the electrodes, etc.

As opposed to the sensing capacitor, precise knowledge of the true capacitance of the coupling capacitor and its variations is not critical for the performance of the coupling capacitor in energy harvesting, PLC or wireless communication. Hence a discrete coupling capacitor that has a rather coarse precision rating can be used, such as 5% or even 10%.

Further to the sensing capacitor and the coupling capacitor of the sensored insulation plug described herein, the sensored insulation plug may comprise one or more further capacitors, coupled to the elevated voltage, to each perform at least one of the following functions selected from the list comprising:

a) detection of presence or absence of elevated voltage in the contact piece;
 b) signal superposition or signal split-off for time-domain reflectometry ("TDR") and frequency-domain reflectometry ("FDR"), where the signal is sent and received by the same node;
 c) signal superposition or signal split-off for TDR and FDR, where the signal is sent by one node and received by another node;
 d) signal superposition or signal split-off for synchronization signals between nodes;
 e) signal superposition or signal split-off for powerline communication;
 f) energy harvesting from the elevated voltage;
 g) sensing of partial discharges in a power cable terminated by the separable connector, and location of related defects in the power cable.

The coupling electrode of the coupling capacitor is electrically connected with the contact piece. It may be conductively connected with the contact piece. In certain embodiments the contact piece comprises a thread, and the coupling electrode of the coupling capacitor is mechanically conductively engaged with the thread. The coupling electrode is thereby mechanically conductively connected with the contact piece.

In certain of these embodiments the thread is arranged at an axial end portion of the contact piece and coaxially with the plug axis. In these embodiments the coupling capacitor may be arranged coaxially with the plug axis. The coupling electrode may be arranged coaxially with the plug axis. The harvesting electrode may be arranged coaxially with the plug axis.

The discrete coupling capacitor has a certain extension in axial directions. The tubular sensing electrode may be arranged coaxially around an axial section of the coupling capacitor.

The contact piece is on the same elevated voltage as the coupling electrode to which it is electrically connected. The sensing electrode may be arranged around the entire high-voltage electrode or around a portion of the high-voltage electrode. The sensing electrode may be arranged around the contact piece or around an axial section of the contact piece. The sensing electrode may be arranged around the coupling electrode or around an axial section of the coupling electrode. Therefore, in certain embodiments the sensing electrode is arranged around an axial section of the contact piece and/or around an axial section of the coupling electrode.

Specifically, the tubular sensing electrode may have a first axial section and a second axial section. The first axial section of the tubular sensing electrode may be arranged around an axial section of the coupling capacitor, and the second axial section of the tubular sensing electrode may be arranged around an axial section of the contact piece. Arrangement of the sensing electrode around a section of the coupling capacitor and an axial section of the contact piece may provide more flexibility on placement of the sensing electrode in axial directions. It may also enable the use of an axially-longer sensing electrode which may help obtain a larger capacitance of the sensing capacitor, resulting in a stronger signal and higher sensing precision.

A traditional power distribution network can be turned particularly easily into a sensored power distribution network by replacing a traditional, non-sensored insulation plug in a separable connector of the network with a sensored insulation plug according to the present disclosure. The present disclosure therefore also provides a power distribution network for distributing electrical power at medium or high voltage and comprising i) a sensored insulation plug as escribed herein, ii) an electrical apparatus, such as a switchgear or a transformer, iii) a power cable, and iv) a separable connector, connected to an end of the power cable, for connecting the power cable to the electrical apparatus, the separable connector having a rear cavity and a connection element on medium or high voltage when in use, accessible through the rear cavity, wherein the sensored insulation plug is arranged in the rear cavity and wherein the contact piece of the sensored insulation plug is electrically connected to the connection element.

The present disclosure also provides a process of upgrading a traditional separable connector to a sensored separable connector by replacing its traditional (sensored or non-sensored) insulation plug with a sensored insulation plug according to the present disclosure. Since no other elements of the separable connector need to be changed or adapted, and no external power needs to be supplied, this upgrading is particularly quick and requires very little peripheral resources. The present disclosure also provides a process of upgrading a separable connector, comprising the steps of
  a) providing a sensored insulation plug according to the present disclosure, and providing a medium voltage or high-voltage separable connector, suitable for connecting a power cable to an electrical apparatus in a medium-voltage or high-voltage power distribution network, such as to a switchgear or to a transformer, the separable connector having a rear cavity and a connection element on medium or high voltage when in use, accessible through the rear cavity;
  b) inserting the sensored insulation plug into the rear cavity;
  c) electrically connecting the contact piece with the connection element.

BRIEF DESCRIPTION OF DRAWINGS

The following Figures illustrate specific aspects of sensored insulation plugs according to the present disclosure.

DETAILED DESCRIPTION

Figure 1:
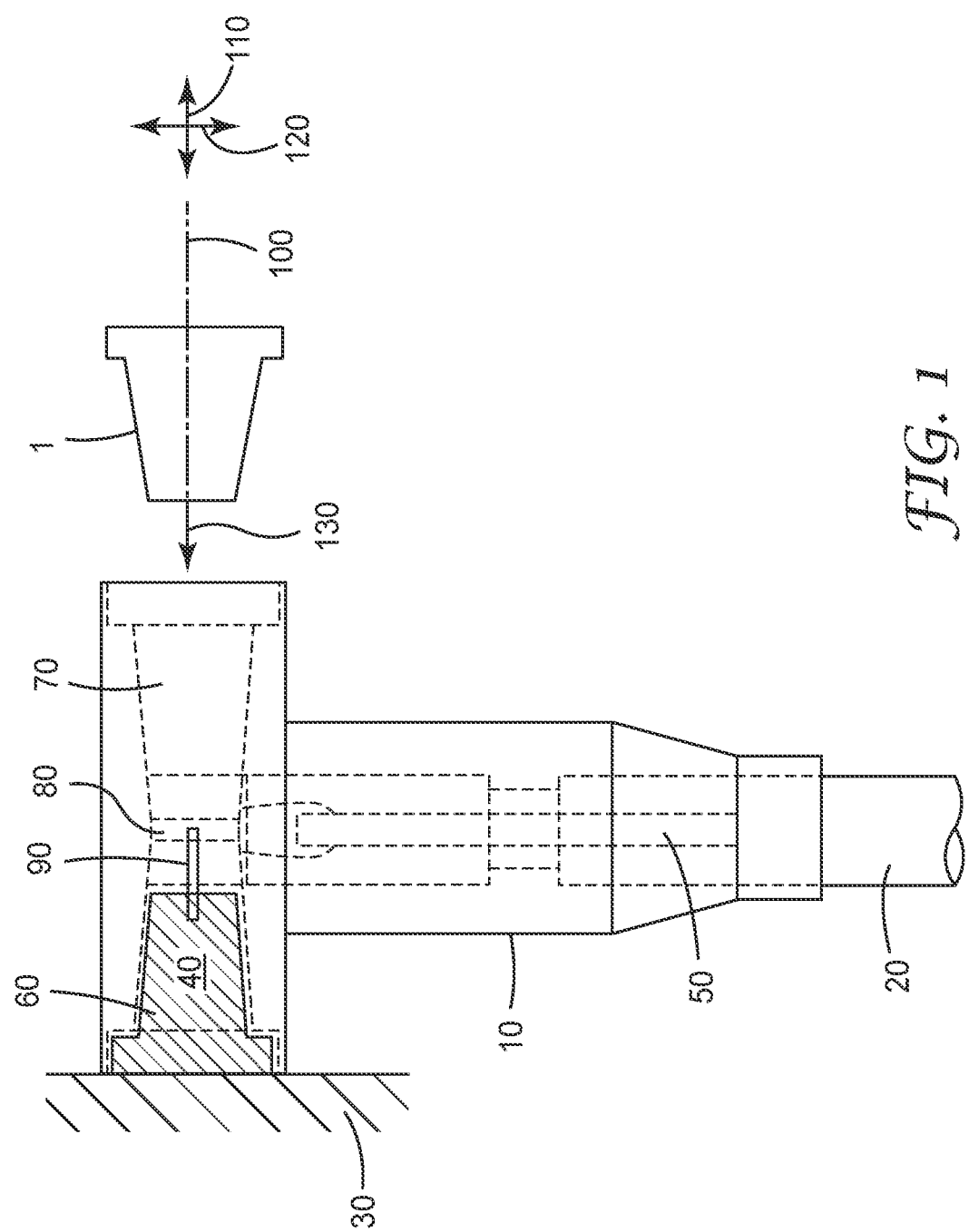
FIG. 1 Sectional view of a separable connector and a first sensored insulation plug according to the present disclosure.

The sectional view of FIG. 1 illustrates a separable connector 10 and a first sensored insulation plug 1 according to the present disclosure. The separable connector 10 is arranged at an end of a medium-voltage power cable 20 and connects, via a bushing 40, the power-carrying central conductor 50 of the cable 20 to a medium-voltage switchgear 30 in a power distribution network of a national grid.

The separable connector 10 is a T-shaped separable connector 10 and comprises a front cavity 60 for receiving the bushing 40, and a rear cavity 70 for receiving an insulation plug of a matching shape. The insulation plug may be a traditional insulation plug without elements of a sensor or a sensored insulation plug 1 according to the present disclosure, shown in FIG. 1 to the right of the rear cavity 70, before being inserted into the rear cavity 70. A traditional insulation plug and a sensored insulation plug 1 according to the present disclosure both serve to electrically insulate a connection element 80 of the separable connector 10, which is electrically connected to the central conductor 50 of the cable 20 and can be electrically and mechanically connected to a conductive component of the bushing 40 via a threaded stud 90. In use, the connection element 80 is on the elevated voltage of the central conductor 50 of the cable.

The body of the first sensored insulation plug 1, just like a traditional insulation plug, has an overall frustoconical outer shape, generally rotationally symmetric about a plug axis 100 which defines axial directions 110 and radial directions 120, which are directions orthogonal to the axial directions 110. The sensored insulation plug 1 can be inserted into the rear cavity 70 by moving it axially in an axial insertion direction 130 into the rear cavity 70 where it is turned by several revolutions about the plug axis 100 to be threadedly engaged—and thereby electrically connected—with the connection element 80 on elevated voltage. The geometry of the sensored insulation plug 1 is adapted to conform to ANSI/IEEE standard 386 to be suitable for a greater number of separable connectors. Depending on where the sensored insulation plug 1 is to be used, it could alternatively be adapted to conform to other standards or be adapted to fit into the most common types of separable connectors in a specific area of the world.

The sensored insulation plug 1 comprises a sensing capacitor and a coupling capacitor, which can both be electrically connected to the connection element 80 on elevated voltage. The sensing capacitor is operable as a high-voltage capacitor in a sensing voltage divider for sensing the elevated voltage, and the coupling capacitor is operable for harvesting energy from the elevated voltage of the high-voltage electrode and optionally for superimposing a communication voltage signal over the elevated voltage of the connection element 80 and of the cable 20.

Figure 2:
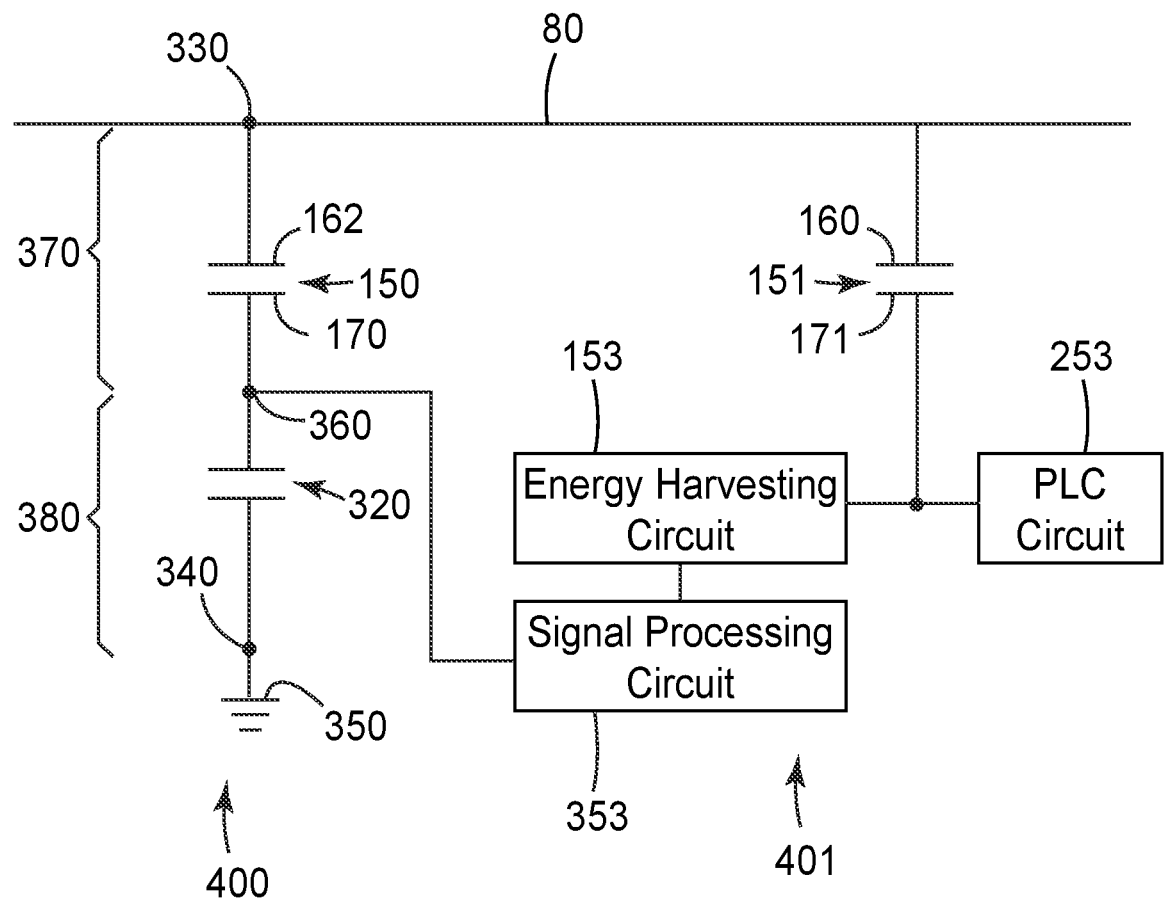
FIG. 2 Circuit diagram of a voltage divider assembly in which a sensored insulation plug according to the present disclosure can be used.

FIG. 2 is a circuit diagram of a sensing voltage divider 400 for sensing the elevated voltage of the separable connector 10 at high precision and of a harvesting and powerline communication setup 401 in which the sensored insulation plug 1 of the present disclosure can be used.

The sensing voltage divider 400 for sensing the elevated voltage of the separable connector 10 is shown electrically connected to the elevated voltage of a connection element 80 of the separable connector 10 on medium or high (i.e. on elevated) voltage. The sensing voltage divider 400 comprises a high-voltage capacitor 150, corresponding to the sensing capacitor 150 in the sensored insulation plug 1 described below, and a low-voltage capacitor 320. These two capacitors are electrically connected in series between a high-voltage contact 330 and a grounding contact 340, held on electrical ground 350.

The high-voltage contact 330 facilitates electrical connection to the connection element 80 on elevated voltage. The grounding contact 340 facilitates connection of the sensing voltage divider 400 to electrical ground 350.

A signal contact 360 is arranged electrically between a high-voltage portion 370 and a low-voltage portion 380 of the sensing voltage divider 400. At the signal contact 360, a divided voltage, also referred to herein as the signal voltage, can be picked up, which varies proportionally with the elevated voltage of the connection element 80. The dividing ratio, i.e. the proportionality factor between the elevated voltage and the signal voltage, depends on the ratio of the total impedance of the high-voltage portion 370 to the total impedance of the low-voltage portion 380 of the voltage divider 400. By measuring the signal voltage of the signal contact 360 and applying the proportionality factor, the elevated voltage of the connection element 80 can be sensed.

In the illustrated embodiment, the high-voltage portion 370 comprises only one capacitor, namely the sensing capacitor 150, with its high-voltage electrode 162 and its sensing electrode 170. In other embodiments the high-voltage portion 370 may comprise, beyond the sensing capacitor 150, one or more further capacitors. It may comprise, beyond the sensing capacitor 150, one or more further impedance elements, such as one or more resistors and/or one or more inductors.

Similarly, in the illustrated sensing voltage divider 400, the low-voltage portion 380 comprises only one capacitor, namely the low-voltage capacitor 320. In other embodiments the low-voltage portion 380 may comprise, beyond the low-voltage capacitor 320, one or more further capacitors. It may comprise, beyond the low-voltage capacitor 320, one or more further impedance elements, such as one or more resistors and/or one or more inductors.

Figure 3:
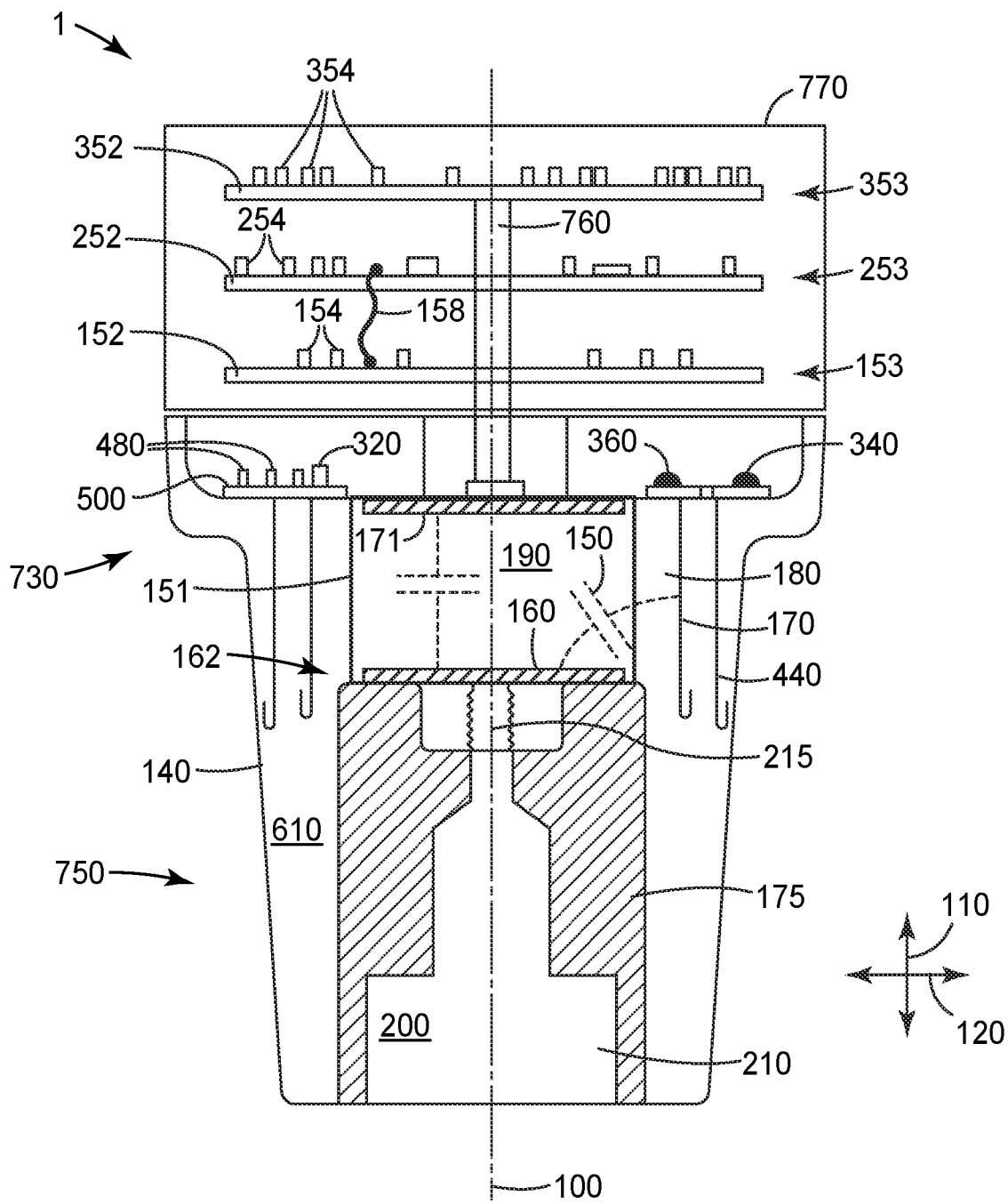
FIG. 3 Sectional view of the first sensored insulation plug according to the present disclosure.

The harvesting and powerline communication setup 401 for harvesting energy from the elevated voltage and for facilitating powerline communication is also electrically connected, via a coupling capacitor 151, to the connection element 80 of the separable connector 10 on medium or high (i.e. elevated) voltage. The harvesting and powerline communication setup 401 comprises the coupling capacitor 151, a harvesting circuit 153, a powerline communication (PLC) circuit 253 and a signal processing circuit 353. The coupling capacitor 151 is a discrete capacitor which exists independently from structural elements of the sensored insulation plug 1. A coupling electrode 160 of the coupling capacitor 151 is electrically conductively connected with the high-voltage electrode 162 of the sensing capacitor 150. Physically the coupling electrode 160 is comprised in the high-voltage electrode 162, as shown in FIG. 3. In the circuit diagram of FIG. 2 they are anyhow drawn separate as they are part of two different capacitors 150, 151. A harvesting electrode 171 of the coupling capacitor 151 is electrically connected with the harvesting circuit 153 and the PLC circuit 253. The signal processing circuit 353 is connected to the signal contact 360 to pick up the signal voltage from the sensing voltage divider 400. The signal processing circuit 353 processes the signal voltage and digitizes it for transmission in a corresponding communication voltage signal generated by the PLC circuit 253. The signal processing circuit 353 and the PLC circuit 253 are powered by energy harvested in the harvesting circuit 153.

FIG. 3 shows, in a sectional view, the first sensored insulation plug 1 according to the present disclosure in greater detail. The sensored insulation plug 1 comprises a plug body 140 of generally frustoconical shape, formed by a solidified insulating material 610, namely an electrically insulating hardened resin 610. The plug body 140 has, in axial directions 110, a low-voltage end portion 730 and an opposed high-voltage end portion 750, which comprises the contact piece 175 and is, in use, closer to the connection element 80 of the separable connector 10.

The sensored insulation plug 1 further comprises an integrated sensing capacitor 150 formed by a high-voltage electrode 162 and a tubular sensing electrode 170, and a discrete coupling capacitor 151 formed by a coupling electrode 160, which is comprised in the high-voltage electrode 162, and an opposed harvesting electrode 171. The coupling capacitor 151 is a single-layer ceramic capacitor 151. The dielectric 190 of the discrete coupling capacitor 151 is arranged between the coupling electrode 160 and the harvesting electrode 171.

In this embodiment the contact piece 175 and the coupling electrode 160 form the high-voltage electrode 162 of the sensing capacitor 150. The dielectric of the sensing capacitor 150 comprises a first portion 180 of the insulating material 610 of the plug body 140, this first portion 180 is located radially between an outer surface the coupling capacitor 151 and the sensing electrode 170. The dielectric of the sensing capacitor 150 also comprises a portion of the dielectric 190 of the coupling capacitor 151.

The tubular sensing electrode 170 is arranged coaxially around an axial section of the high-voltage electrode 162. Specifically, it is arranged coaxially around an axial section of the contact piece 175 and around the coupling electrode 160 of the coupling capacitor 151. The contact piece 175 and the coupling electrode 160 are electrically connected with each other via the conductive screw 215 and are thus on the same elevated voltage when the sensored insulation plug 1 is in use.

The sensored insulation plug 1 further comprises a tubular shield electrode 440, arranged coaxially around the sensing electrode 170. The shield electrode 440 can be grounded to shield the sensing electrode 170 against external electrical fields and thereby obtain a higher precision in sensing the elevated voltage.

The coupling capacitor 151, its coupling electrode 160 and its harvesting electrode 171, and the sensing electrode 170 are each rotationally symmetric about a plug axis 100 and arranged coaxially with each other and with the plug axis 100.

The sensored insulation plug 1 comprises a contact piece 175 to mechanically and conductively connect the sensored insulation plug 1 with the connection element 80 of the separable connector 10 on elevated voltage. This contact piece 175 is generally rotationally symmetric about the plug axis 100 and has an engagement portion 210 for connecting the contact piece 175 mechanically and electrically with the connection element 80 of the separable connector 10. For that purpose, the engagement portion 210 comprises a threaded recess 200.

At its opposite end, the contact piece 175 is mechanically and electrically conductively connected with the coupling electrode 160 of the coupling capacitor 151 through a conductive screw 215 so that these elements are on the same elevated voltage when in use.

The sensing electrode 170, the shield electrode 440 and the coupling capacitor 151 are each completely surrounded by the insulating material 610 of the plug body 140. In other words, they are each embedded in the insulating material 610. The major surfaces of the sensing electrode 170 and the outer surface of the coupling capacitor 151 are in surface contact with the surrounding insulating material 610 of the plug body 140 in which the sensing electrode 170 and the coupling capacitor 151 are embedded.

The insulating material 610 of the plug body 140 is a hardened epoxy resin with certain fillers. In manufacturing, the resin in its liquid state is cast or molded around the coupling capacitor 151, the sensing electrode 170 and the shield electrode 440 in a mold that determines the outer shape of the plug body 140 of the sensored insulation plug 1. A major part of the resin 610 flows under pressure around the sensing electrode 170, around the shield electrode 440 and around the coupling capacitor 151. The resin 610 is then cured or hardened to solidify, resulting in a solid insulating plug body 140 in which the sensing electrode 170, the shield electrode 440 and the coupling capacitor 151 are embedded. The electrical breakdown strength of the insulating material 610 is high enough to reliably prevent electric discharges between the coupling electrode 160 on elevated voltage and the sensing electrode 170 and between the coupling electrode 160 on elevated voltage and the shield electrode 440.

The sensing electrode 170 is mechanically supported by a flat, rigid circuit board 500 of generally annular shape, arranged coaxially with the plug axis 100. The circuit board 500 comprises conductive traces by which electric and electronic components 480, such as the sensing electrode 170, arranged respectively on the upper surface and on the lower surface of the circuit board 500, are electrically connected with each other. In particular, a low-voltage capacitor 320 is arranged on the circuit board 500. This low-voltage capacitor 320 is electrically connected in series between the sensing electrode 170 and a grounding contact 340 which can be externally connected to electrical ground 350. The low-voltage capacitor 320 forms the low-voltage portion 380 of a sensing voltage divider 400 for sensing the elevated voltage, with the sensing capacitor 150 forming the high-voltage portion 370 of the sensing voltage divider 400, as shown in FIG. 2. The divided voltage, i.e. the "signal voltage", of the sensing voltage divider 400 can be accessed at a signal contact 360 on the circuit board 500. As is generally known for voltage dividers, the signal voltage varies proportionally with the elevated voltage of the high-voltage electrode 162, so that the elevated voltage of the high-voltage electrode 162—and thereby the elevated voltage of the connection element 80 of the separable connector 10—can be determined by measuring the signal voltage at the signal contact 360 and multiplying it with the dividing ratio of the sensing voltage divider 400.

The coupling capacitor 151 is a discrete capacitor that exists independently from any structural features of the sensored insulation plug 1. It can be obtained as a standalone element and can then be assembled in the sensored insulation plug 1.

The coupling capacitor 151 is operable to harvest energy from the elevated voltage. For that purpose, the harvesting electrode 171 is electrically connected with an harvesting circuit 153 via a conductive pin 760. The harvesting circuit 153 comprises electric and electronic components 154 and a harvesting circuit board 152 on which the components 154 are arranged, for harvesting electrical energy and storing the harvested energy for powering other electronic components. One of the electric components 154 is a rectifier (not shown) which is required for converting AC currents into DC currents that can be used to power other components or that can be stored in a storage capacitor (not shown). The harvesting circuit 153 is arranged in an end cap 770, which serves to cover the exposed low-voltage end portion 730 of the plug body 140.

The coupling capacitor 151 of the embodiment shown in FIG. 3 is also operable to superimpose a communication voltage signal over the elevated voltage of the contact piece 175 and to extract a communication voltage signal from the elevated voltage of the contact piece 175. For the purposes of superimposing and extracting communication voltage signals, the harvesting electrode 171 is electrically connected with a powerline communication circuit 253, also referred to herein as a PLC circuit 253, via the conductive pin 760. The PLC circuit 253 comprises electronic components 254 and a PLC circuit board 252 on which the components 254 are arranged, for superimposing and extracting communication signals. The PLC circuit 253 is also arranged in the end cap 770.

The signal voltage at the signal contact 360 varies proportionally with the elevated voltage. It facilitates sensing of the elevated voltage at high precision and is the output of the sensing voltage divider 400. In order to generate and transmit a communication voltage signal comprising data representing this signal voltage, the signal voltage is processed and digitized using an analogue-to-digital converter ("A/D converter" or "ADC") and other electronic components. The first sensored insulation plug 1 therefore comprises a signal processing circuit 353 which is electrically connected to the signal contact 360 to pick up the signal voltage. The signal processing circuit 353 comprises electronic components 354 and a signal processing circuit board 352 on which the components 354 are arranged, for processing and digitizing the signal voltage. The processed and digitized signal voltage is conducted to the PLC circuit 253, e.g. via a wire (not shown), which processes it further and transmits a value of the signal voltage by superimposing a corresponding communication voltage signal over the elevated voltage. The signal processing circuit 353 is powered by energy harvested via the coupling capacitor 151 and the harvesting circuit 153 and is therefore connected to the harvesting circuit 153, e.g. via a wire (not shown). The signal processing circuit 353 is also arranged in the end cap 770.

The PLC circuit 253 is connected with the signal contact 360 by a signal wire (not shown). The PLC circuit 253 is operationally connected via an interface wire 158 with the harvesting circuit 153 in a suitable manner such that electrical energy harvested by the harvesting circuit 153 is useable to supply energy to the PLC circuit 253.

The PLC circuit 253 facilitates powerline communication with other elements of a communication network, e.g. a network of the network operator. In particular it facilitates PLC communication with other sensed insulation plugs 1, 2 of the type described herein. Generally, the outgoing PLC communication preferably contains data representing a value of the sensed voltage in analogue or digital form. Incoming communication may contain signals like, for example, control signals or sync signals from other nodes in the operator's network or from a central network control center.

In the embodiment of FIG. 3 the harvesting circuit 153, the PLC circuit 253 and the signal processing circuit 353 are arranged in an end cap 770 attached to the plug body 140. It is contemplated that in alternative embodiments one of these circuits 153, 253, 353, or two of these circuits 153, 253, 353, or all of these circuits 153, 253, 353 may be arranged remote from the plug body 140.

Figure 4:
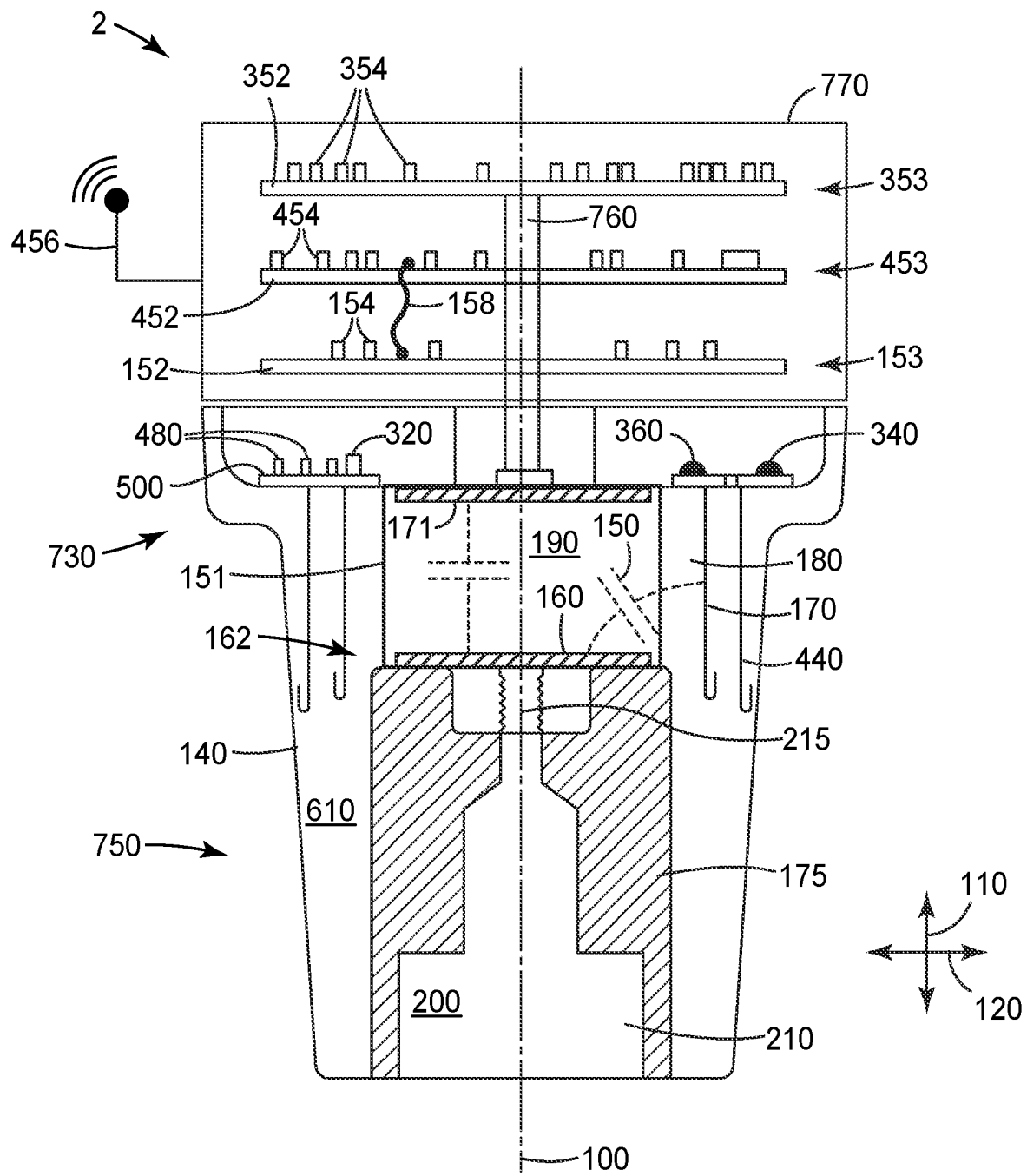
FIG. 4 Sectional view of a second sensored insulation plug according to the present disclosure.

FIG. 4 is a sectional view of a second sensed insulation plug 2 according to the present disclosure. The second sensed insulation plug 2 is identical with the first sensed insulation plug 1 shown in FIG. 3, except that it transmits and receives a communication voltage signal wirelessly via an antenna instead of via powerline communication.

Instead of the PLC circuit 253, the second sensed insulation plug 2 comprises a wireless circuit 453, arranged in the end cap 770. The wireless circuit 453 comprises electronic components 454 and a wireless circuit board 452 on which the components 454 are arranged.

The wireless circuit 453 is operable to wirelessly receive and transmit communication voltage signals, e.g. communication voltage signals comprising data representing the signal voltage or synchronization signals. The wireless circuit 453 is operationally connected with an antenna 456 mounted on an external surface of the end cap 770. The antenna 456 facilitates wireless receiving and transmission of such communication voltage signals.

The wireless circuit 453 facilitates wireless communication with other elements of a communication network, e.g. a network of the network operator or a public mobile communication network. In particular, it facilitates wireless communication with other sensed insulation plugs 1, 2 of the type described herein. Generally, the outgoing communication preferably contains data representing a value of the sensed voltage in analogue or digital form. Incoming communication may contain control signals or sync signals from other nodes in the network or from a central network control center.

What is claimed is:

1. Sensored insulation plug for being inserted into a rear cavity of a medium voltage or high-voltage separable connector in a power distribution network of a national grid, and operable to insulate a connection element of the separable connector on an elevated voltage and to sense the elevated voltage, the sensored insulation plug comprising:
 a) a plug body formed by a solidified insulating material and rotationally symmetric about a plug axis defining axial directions and radial directions orthogonal to the axial directions;
 b) an electrically conductive contact piece, mechanically and conductively connectable with the connection element on elevated voltage;
 c) a discrete coupling capacitor, operable to harvest energy from the elevated voltage of the contact piece and operable to superimpose a communication voltage signal over the elevated voltage of the contact piece, wherein the coupling capacitor is embedded in the insulating material and comprises a coupling electrode, electrically connected to the contact piece, and an opposed harvesting electrode;
 d) an integrated sensing capacitor, operable as a high-voltage capacitor in a sensing voltage divider for sensing the elevated voltage, the sensing capacitor comprising:
   i) a high-voltage electrode, wherein the high-voltage electrode comprises the coupling electrode and the contact piece;
   ii) a tubular sensing electrode, embedded in the insulating material and arranged around an axial section of the high-voltage electrode,
   iii) a dielectric comprising a portion of the insulating material arranged between the sensing electrode and the coupling capacitor.

2. Sensored insulation plug according to claim 1, wherein the coupling capacitor has a capacitance of 100 picofarad or more.

3. Sensored insulation plug according to claim 1, wherein the coupling electrode is flat and oriented parallel to a geometric plane extending in radial directions.

4. Sensored insulation plug according to claim 1, wherein the coupling capacitor is a single-layer capacitor, such as a single-layer ceramic capacitor.

5. Sensored insulation plug according to claim 1, wherein the sensing electrode is arranged around an axial section of the contact piece and/or around an axial section of the coupling electrode.

6. Sensored insulation plug according to claim 1, further comprising a harvesting circuit, electrically connected to the harvesting electrode, and operable to harvest electrical energy from the elevated voltage.

7. Sensored insulation plug according to claim 6, wherein the harvesting circuit comprises a rectifier, connected to the harvesting electrode, for rectifying a voltage of the harvesting electrode, and wherein the harvesting circuit further comprises a storage capacitor for storing harvested electrical energy.

8. Sensored insulation plug according to claim 6, further comprising a signal processing circuit, electrically connected to the sensing electrode, and operable to process a signal voltage of the sensing electrode,
 wherein the signal processing circuit is electrically connected to the harvesting circuit such that the signal processing circuit receives electrical energy from the harvesting circuit.

9. Sensored insulation plug according to claim 8, wherein the signal processing circuit comprises an analogue-to-digital converter for digitizing the signal voltage.

10. Sensored insulation plug according to claim 6, further comprising a powerline communication circuit, electrically connected to the coupling capacitor, and operable to superimpose, via the coupling capacitor, a communication voltage signal over the elevated voltage, and/or operable to extract, via the coupling capacitor, a communication voltage signal from the elevated voltage,
 wherein the powerline communication circuit is electrically connected to the harvesting circuit such that the powerline communication circuit receives electrical energy from the harvesting circuit.

11. Sensored insulation plug according to claim 6, further comprising a wireless communication circuit operable to generate and wirelessly transmit a communication voltage signal to outside the sensored insulation plug, wherein the wireless communication circuit is electrically connected to the harvesting circuit such that the wireless communication circuit receives electrical energy from the harvesting circuit.

12. Sensored insulation plug according to claim 11, wherein the wireless communication circuit is further operable to wirelessly receive a communication voltage signal from outside the sensored insulation plug.

13. Sensored insulation plug according to claim 6, further comprising an end cap attached to a low-voltage end portion of the plug body, wherein the harvesting circuit is arranged in the end cap.

14. Power distribution network for distributing electrical power at medium or high voltage and comprising
   i) a sensored insulation plug according to claim 1;
   ii) an electrical apparatus, such as a switchgear or a transformer;
   iii) a power cable; and
   iv) a separable connector, connected to an end of the power cable, for connecting the power cable to the electrical apparatus,
   the separable connector having a rear cavity and a connection element on medium or high voltage when in use, accessible through the rear cavity;
   wherein the sensored insulation plug is arranged in the rear cavity and wherein the contact piece of the sensored insulation plug is electrically connected to the connection element.

15. Process of upgrading a separable connector, comprising the steps of
   a) providing a sensored insulation plug according to claim 1, and providing a medium voltage or high-voltage separable connector, suitable for connecting a power cable to an electrical apparatus in a medium-voltage or high-voltage power distribution network, such as to a switchgear or to a transformer, the separable connector having a rear cavity and a connection element on medium or high voltage when in use, accessible through the rear cavity;
   b) inserting the sensored insulation plug into the rear cavity;
   c) electrically connecting the contact piece with the connection element.

* * * * *